(12) United States Patent
Matsuno

(10) Patent No.: US 7,242,080 B2
(45) Date of Patent: Jul. 10, 2007

(54) SEMICONDUCTOR WAFER WITH INFORMATION PROTECTION FUNCTION

(75) Inventor: Noriaki Matsuno, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 10/990,545

(22) Filed: Nov. 18, 2004

(65) Prior Publication Data

US 2005/0104161 A1     May 19, 2005

(30) Foreign Application Priority Data

Nov. 18, 2003   (JP)   ............................ P.2003-387974

(51) Int. Cl.
*H01L 23/58*   (2006.01)
(52) U.S. Cl. ...................... 257/679; 257/922
(58) Field of Classification Search ................ 257/48, 257/620, 679, 922; 438/11, 14, 15, 18; 713/194; 324/765
See application file for complete search history.

(56) References Cited

U.S. PATENT DOCUMENTS

| | | | |
|---|---|---|---|
| 5,446,395 A * | 8/1995 | Goto ........................... | 324/763 |
| 5,861,652 A | 1/1999 | Cole et al. | |
| 6,228,684 B1 * | 5/2001 | Maruyama ................... | 438/113 |
| 6,365,443 B1 * | 4/2002 | Hagiwara et al. ............ | 438/130 |
| 6,492,666 B2 | 12/2002 | Terada et al. | |
| 6,881,597 B2 * | 4/2005 | Asayama et al. ............. | 438/18 |
| 7,005,733 B2 * | 2/2006 | Kommerling et al. ...... | 257/679 |

FOREIGN PATENT DOCUMENTS

| | | | |
|---|---|---|---|
| EP | 1 079 430 | | 2/2001 |
| EP | 1 139 424 | | 10/2001 |
| JP | 355135759 A | * | 10/1980 |
| JP | 404080936 A | * | 3/1992 |
| JP | 2001-135597 | | 5/2001 |
| JP | 2002-313860 | | 10/2002 |
| JP | 2003-218178 | | 7/2003 |
| JP | 02003288577 A | * | 10/2003 |
| JP | 2003-324156 | | 11/2003 |

OTHER PUBLICATIONS

Samyde, David et al, "On a New Way to Read Data from Memory", Proceedings of the First International IEEE Security in Storage Workshop (SISW'02), 0-7695-1888-5/03, 2003.*

* cited by examiner

*Primary Examiner*—Sara Crane
*Assistant Examiner*—Ajay Arora
(74) *Attorney, Agent, or Firm*—McDermott Will & Emery LLP

(57) ABSTRACT

When the scribe region 2 is cut off, the dicing detector 53 sends the detection signal A to the changeover circuit 51 and electrically shuts off the pad 50 and the inspection objective circuit 52, and the fixed potential of the input and output passage 54 from the changeover circuit 51 to the inspection objective circuit 52 is monitored by the detector 55. At the same time, the detection objective circuit 52 is changed into a mode, in which a reception of the command of the inspection mode is refused, by the detection signal A. In the case where an abnormality of the fixed potential of the input and output passage 54 is grasped, the inspection objective circuit 52 is changed into the safety mode.

12 Claims, 12 Drawing Sheets

SEMICONDUCTOR WAFER WITH INFORMATION PROTECTION FUNCTION

SUMMARY OF THE INVENTION

1. Field of the Invention

The present invention relates to a semiconductor wafer having a protective function of protecting secret information, which is stored in the semiconductor device, from being analyzed and tampered by an illegitimate means.

2. Description of the Related Art

Recently, as a technique for reducing the semiconductor area and providing the anti-tampering property, such a technique has been commonly used that the inspection pads are arranged on the scribe and cut off at the time of dicing. According to the above technique, when the semiconductor area is reduced by cutting off the inspection pads and further the wiring passage from the outside to the inside of the semiconductor device is physically shut off, the secret information stored in the semiconductor device can be protected from being illegitimately analyzed by utilizing the inspection pads, and further the reliability can be ensured at the time of working when the inspection pads are cut off.

FIG. 12 is a view showing a portion of the structure of the conventional semiconductor wafer. As shown in FIG. 12, the pad 50 for inspection arranged in the scribe region 2 is connected to the inspection objective circuit 52 via MOS transistor 81, and the pad 83 for control arranged in the scribe region 2 is connected to the gate of MOS transistor 81.

In the above constitution, the pad 50 for inspection is arranged in the scribe region 2, and a metallic wire is laid from the pad 50 for inspection to the chip region 1 exceeding the seal ring 3 and connected to the inspection objective circuit 52 via MOS transistor 81. At the time of inspecting the wafer, a signal for turning on MOS transistor 81 at all times is inputted from the pad 83 for control into MOS transistor 81, so that an input and output passage from the pad 50 for inspection to the inspection objective circuit 52 can be opened so as to conduct the inspection. After the completion of inspecting the wafer, the semiconductor device is cut off along the dicing line 4. After that, a passage of the metallic wire 82 is physically shut off by the following two methods in order to prevent the occurrence of short circuit caused by scraps generated in the process of dicing and further in order to prevent the occurrence of corrosion and furthermore in order to protect the semiconductor device from illegitimately analyzed when the lead-in wire from the pad 50 for inspection is utilized.

One is a method in which the metallic wire 82 is assumed as a fuse and after the completion of dicing, the metallic wire 82 is irradiated with laser beams so as to melt the metallic wire 82. According to this method, the lead-in wire from the pad 50 for inspection and the passage to the inside of the semiconductor device are shut off. The other is a method in which a high electric field is impressed upon MOS transistor 81 by the pad 83 for control before the process of dicing so as to break MOS transistor 81 and then dicing is conducted. Of course, both the methods can be used together. In either method, the lead-in wire from the pad 50 for inspection and the passage to the inside the semiconductor device are cut off so as to protect the semiconductor device from being analyzed by an illegitimate analyzing means.

(Patent Document 1) JP-A-2001-135597

Even when the above prior art is applied, the wire passage led out from the pad, which has been cut off, can be easily, physically restored by the technique of FIB (Focused Ion Beam). For example, in order to irradiate laser beams and melt the wire, a fuse window is arranged in the chip region. Therefore, when the layout is observed, the melted portion can be easily found, and the wire to be connected to the pad can be specified. Therefore, by the technique of micro-probe and FIB, an input and output passage can be made so that the inside and the outside can be connected. By utilizing the input and output passage, an illegitimate analysis can be made and the stored information can be tampered. Even when the method of breaking MOS transistor is applied, a trace of the breaking can be visually recognized when the layout is observed. Therefore, when the connection node of the source drain of MOS transistor is short-circuited by the technique of FIB and an input and output passage from the outside is made by the micro-probe technique, an illegitimate analysis can be conducted and the stored information can be tampered by utilizing the thus formed passage, that is, the protective function of the above method is fragile. Further, in order to execute the above method, it is necessary to provide not only the dicing process but also the cutting process by irradiating laser beams and the breaking process of breaking MOS transistor 81. Therefore, the manufacturing process becomes complicated, which raises the manufacturing cost.

SUMMARY OF THE INVENTION

An object of the present invention is to provide a semiconductor wafer in which the protection capacity of protecting the semiconductor wafer from an illegitimate analysis is further enhanced.

The present invention provides a semiconductor wafer on which a plurality of semiconductor devices including an inspection objective circuit are arranged via a scribe region, comprising: a detection means for detecting that the scribe region has been cut off; a changeover means for changing over an electric potential between the inspection objective circuit and the inspection pad for the inspection objective circuit into a fixed electric potential; and a mode change means for changing a mode of the inspection objective circuit into a safety mode when an abnormal electric potential is detected between the changeover means and the inspection objective circuit. According to this constitution, after the scribe region has been cut, an abnormality of the electric potential between the changeover means and the inspection objective circuit is detected and the mode of the inspection objective circuit is changed to the safety mode. (In this case, the safety mode is a mode in the fixed state in which the inspection objective mode can not be restored unless the electric power source of the semiconductor device is shut off, for example, the safety mode is a mode in which the action is fixed in the reset state or the secret information is eliminated from the memory.) Due to the foregoing, it is possible to prevent an illegitimate analysis conducted by utilizing a lead-in wire led from the pad after the scribe region has been cut.

In the present embodiment, it is preferable that the mode change means has a function of refusing an inspection command inputted into the inspection objective circuit. According to this constitution, when the inputting of an inspection command into the inspection objective circuit is refused, it is possible to prevent the inspection objective circuit from being changed into an inspection mode by an illegitimate means.

In the present invention, the detection means includes: a resistor connected to an electric potential of the electric power source provided in the semiconductor device; a monitoring wire connected to the resistor and also connected to an electric potential of the ground in the semiconductor device while crossing a dicing line in the scribe region; and a detection means for detecting a change in the electric potential of the monitoring wire. Due to the above constitution, when the monitoring wire is provided which is connected to the ground potential in the semiconductor device while the monitoring wire is crossing the dicing line of the scribe region, it is possible to separate both end portions of the monitor line from each other. Therefore, it becomes possible to restore the monitoring wire.

In the present invention, it is preferable that the monitoring wire is arranged surrounding a pad for inspection arranged in the scribe region or surrounding a dummy wire laid in the scribe region from the semiconductor device. Due to the above constitution, when the monitoring wire is arranged surrounding the pad for inspection and the dummy wire for confusion, both end portions of the monitoring wire can be further separated from each other. Therefore, it becomes impossible to easily restore the monitoring wire, and the anti-tampering property can be enhanced.

In the present invention, the detection means includes: a pad for inputting a monitor signal arranged in the scribe region, for giving a signal of an arbitrary characteristic to the monitoring wire; and a characteristic change detection means for detecting a change in the characteristic of the monitoring wire. According to this constitution, unless the signal itself given to the monitoring wire is detected, it is impossible to nullify the detection means. Therefore, the anti-tampering property can be remarkably enhanced.

In the present invention, the detection means includes: a signal generating means arranged in the scribe region, for giving a signal of an arbitrary characteristic to the monitoring wire; and a characteristic change detection means for detecting a change in the characteristic of the monitoring wire. According to this constitution, unless the signal itself given to the monitoring wire is detected, it is impossible to nullify the detection means. Therefore, the anti-tampering property can be remarkably enhanced. Further, since it is unnecessary to supply a signal from the outside, it is possible to suppress an increase in the inspection cost of the wafer.

In the present invention, the detection means includes: a signal generating means arranged in the semiconductor device, for giving a signal of an arbitrary characteristic to the monitoring wire; and a characteristic abnormality detection means for detecting a characteristic abnormality of the monitoring wire for a reference signal to detect the cutting of the scribe region. According to this constitution, a signal having the fixed signal characteristic is not detected but a signal is detected by the relative comparison with the reference signal. Therefore, it becomes possible to generate a plurality of signal patterns from the signal generation means. Accordingly, the anti-tampering property can be remarkably enhanced.

In the present invention, the detection means includes: a signal generating means arranged in the scribe region, for giving a signal of an arbitrary characteristic to the monitoring wire; and a characteristic abnormality detection means for detecting a characteristic abnormality of the monitoring wire with respect to a reference signal to detect the cutting of the scribe region. According to this constitution, since the signal generation means is cut off by cutting the scribe region, it is possible to nullify a means for observing a signal from the outside by putting a probe. Therefore, the anti-tampering property can be further enhanced.

In the present invention, it is preferable that the signal generation means generates random numbers. According to this constitution, it is possible to change a monitoring signal each time. Therefore, the anti-tampering property can be further enhanced.

A semiconductor wafer according to the present invention further comprises a judgment means for judging the cut of the scribe region according to the detection signals sent from a plurality of detection means. According to this constitution, the cutting of the scribe region is judged on the basis of the result of detection conducted by a plurality of the detection means. Therefore, when it is composed in such a manner that the protecting function can not be released unless all the detection means are nullified, the anti-tampering property can be remarkably enhanced. Further, when the detection means of the different types are combined with each other, it becomes more difficult for all the dicing detection means to be nullified. Therefore, the anti-tampering means can be enhanced.

A semiconductor wafer of the present invention further comprises a failure diagnosis means for diagnosing a failure of the detection means according to the result of comparison between the detection output of the detection means with respect to a test signal given to the detection means and the expected value. According to this constitution, the failure detection means for detecting a failure of the detection means is further provided. Therefore, even when the detection means is nullified, the semiconductor device can be set in the safety mode by the failure diagnosis means.

A semiconductor wafer of the present invention further comprises: a memory for accommodating information showing whether or not the scribe region has been cut; and a judgment means for judging the cut of the scribe region by comparing the output of the detection means with the information stored in the memory. According to this constitution, the judgment means for judging the cutting of the scribe region by comparing the output of the detection means with the information showing a state of cutting in the scribe region is further provided. Therefore, unless two pieces of information in the detection means and the memory are nullified, it is impossible to release the protecting function in the inspection objective circuit. Accordingly, the anti-tampering property can be further enhanced.

According to the present invention, when an abnormal potential between the changeover means and the inspection objective circuit is detected and the mode of the inspection object circuit is changed to the safety mode after the scribe region has been cut, it is possible to prevent a person from conducting an illegitimate analysis which is made by utilizing the lead-in wire led from the pad after the scribe region has been cut.

DESCRIPTION OF THE PREFERRED EMBODIMENTS

Figure 1:
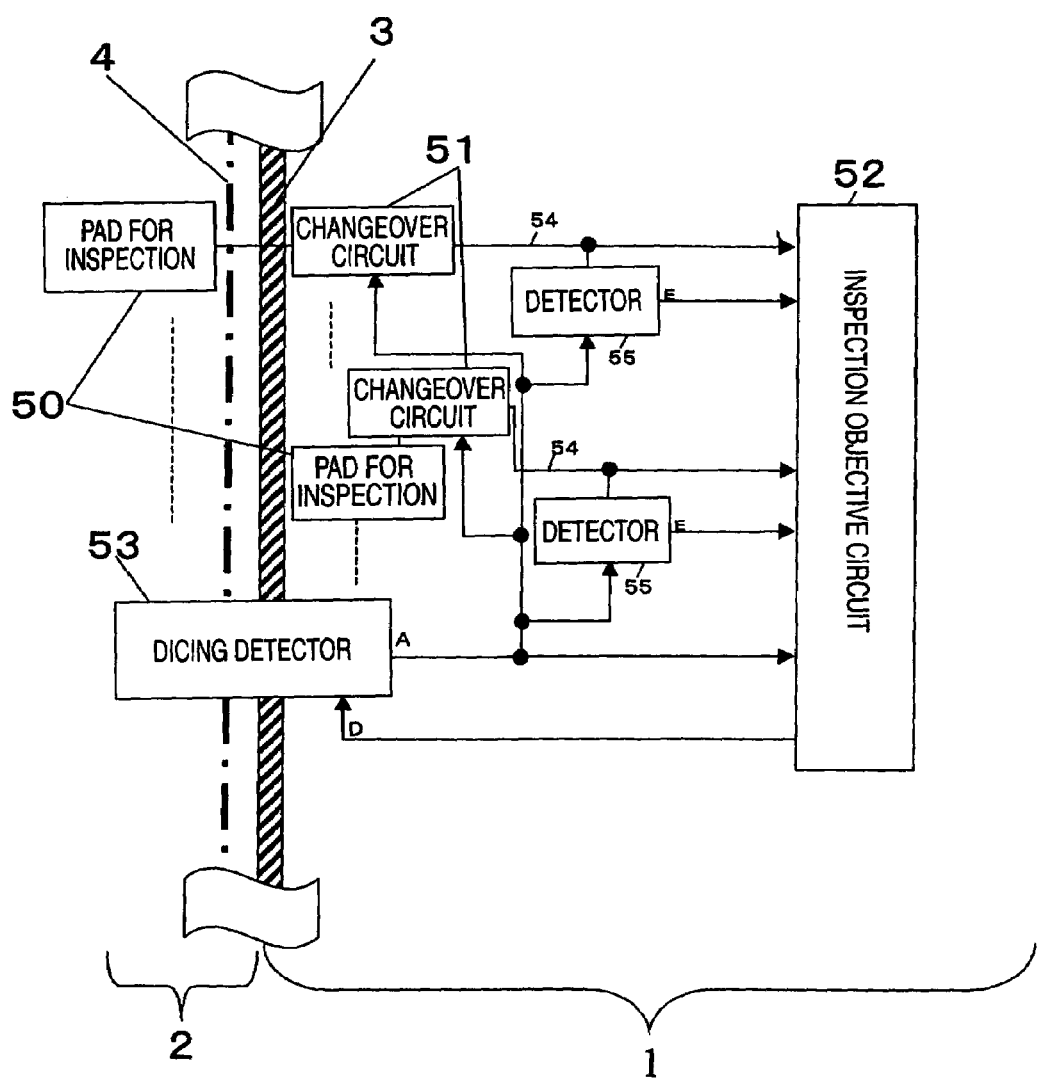
FIG. 1 is an enlarged schematic plan view showing a portion of the semiconductor wafer of the first embodiment.

Referring to the drawings, an embodiment of the present invention will be explained in detail below. In this connection, like parts are indicated by the same reference numerals and signs in the drawings and the explanations are not duplicated here.

First Embodiment

The constitution of the first embodiment of the present invention is shown in FIG. 1. According to this constitution, the semiconductor wafer is composed so that the secret information stored in the semiconductor device can be protected from an analysis conducted by an illegitimate means in which a wiring passage from the pad is utilized. In FIG. 1, in the semiconductor wafer, a plurality of the chip regions 1 (the semiconductor devices) including the inspection objective circuits 52 are arranged via the scribe region 2. The semiconductor wafer includes: one or a plurality of pads 50 for inspection arranged in the scribe region 2 or the chip region 1; a changeover circuit 51 for electrically shutting off the input and output passage 54 so as to change over to the fixed potential; a detector 55 for monitoring the electric potential of the input and output passage 54; and a dicing detector 53 for detecting whether or not the semiconductor device has been cut out from the semiconductor wafer when the scribe region is cut off. In the case where the pad 50 for inspection is arranged in the scribe region 2, the wire from the pad 50 for inspection is led in the chip region 1 exceeding the seal ring 3.

The wire from the pad 50 for inspection is connected to the inspection objective circuit 52 via the changeover circuit 51, and the illegitimacy detection signal E sent from the detector 55 is also connected to the inspection objective circuit 52. The control signal D for controlling the dicing detector is inputted from the inspection objective circuit 52 into the dicing detector 53. The detection signal A of the dicing detector 53 is inputted into the changeover circuit 51 and the inspection objective circuit 52.

The action of the protection circuit composed as described above will be explained below. At the time of inspecting the wafer in a factory, since the scribe region is not cut off, the dicing detector 53 sends the detection signal A, which is in the state in which the semiconductor device is not cut off from the semiconductor wafer, to the changeover circuit 51. The input and output passage 54 between the pad 50 for inspection and the inspection objective circuit 52 is electrically connected, and the detector 55 is nullified, and the input and output passage 54 for transmitting the input and output information, which is sent from the pad 50 for inspection, to the inspection objective circuit 52 is opened. The detection signal A is also transmitted to the inspection objective circuit 52, so that the signal sent from the pad 50 for inspection can be inputted and outputted. A reception of the command of the test mode sent from the outside is allowed. In this way, the inspection objective circuit 52 can be set in a state in which the inspection can be made.

After the inspection has been made, the scribe region 2 is cut along the dicing line 4, and the pad 50 for inspection, which is arranged in the scribe region 2, and a portion of the dicing detector 53, which is formed in the scribe region 2, are cut off. When the scribe region is cut off, the dicing detector 53 is composed so that the electric characteristic of the signal monitored can be changed, and the change in the electric characteristic is grasped. The detection signal A in the state in which the semiconductor device is cut out from the semiconductor wafer is transmitted to the changeover circuit 51. The input and output passage 54 between the pad 50 for inspection and the inspection objective circuit 52 is electrically shut off. The input and output passage 54 from the changeover circuit 51 to the inspection objective circuit 52 is set at a fixed potential. Then, the detector 55 is started, and an electric potential of the input and output passage 54 is monitored.

The inspection objective circuit 52 is controlled by the detection signal A, and a reception of the command of the inspection mode is refused (Control is conducted so that the allowed/not-allowed control of the inspection mode is set at not-allowed.). In the case where an abnormality of the fixed potential of the input and output passage 54 is grasped, the illegitimacy inspection signal E is outputted from the detector 55. By the signal concerned, the mode is changed to the fixed state to which the semiconductor device is not returned unless the electric power source of the semiconductor device is shut off, for example, the action is fixed to the reset state. Alternatively, the mode is changed into the safety mode in which the secret information stored in the semiconductor device is eliminated. Due to the foregoing, an illegitimate analysis can be prevented.

In the semiconductor device of the present invention, the protecting function is exhibited by the dicing detector 53. Therefore, the grade of the anti-tampering of the dicing detector determines the protection capacity. An embodiment of the dicing detector will be explained as follows.

[First Embodiment of Dicing Detector]

Figure 2:
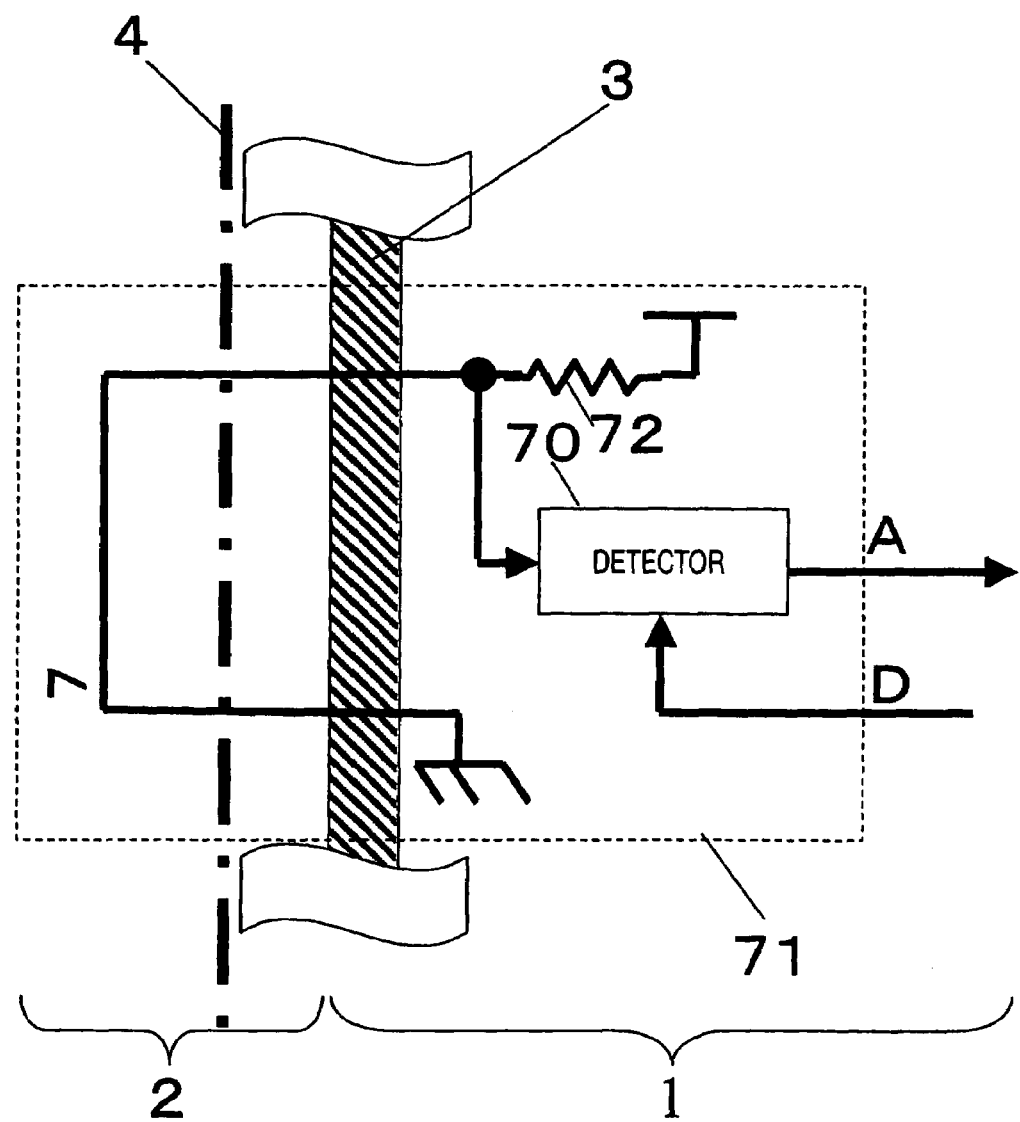
FIG. 2 is a schematic plan view showing an embodiment of the dicing detector shown in FIG. 1.

FIG. 2 is a simple arrangement view of the dicing detector 71 of the first embodiment. The dicing detector 71 is composed as follows. The dicing detector 71 includes: a monitoring wire 7 provided in such a manner that the resistor 72 is connected between the monitoring wire 7 and $V_{dd}$ fixed potential (the electric power source potential) by the pull-up connection, the monitoring wire 7 being arranged long in a range from the chip region 1 to the scribe region 2 exceeding the seal ring 3, the monitoring wire 7 exceeding the seal ring 3 again and being led into the chip region 1; and a detector 70 for monitoring the fixed potential of the monitoring wire 7 arranged in the chip region 1.

Next, the action of the first dicing detector 71 will be explained below. Before the semiconductor device is cut out from the semiconductor wafer, the fixed potential level of the monitoring wire 7 is $V_{ss}$, and the monitoring wire 7 passing from $V_{dd}$ to the resistor 72 and branching at the position before the seal ring 3 is inputted into the detector 70. The detector 70 conducts a detecting action being controlled by the control signal D. While $V_{ss}$ is being detected, the detector 70 outputs the detection signal A showing a state before dicing.

On the other hand, when the scribe region is cut off along the dicing line 4, the scribe region portion of the monitoring wire 7 is cut off. At this time, a portion of the monitoring wire 7, which is inputted into the detector 70, to which $V_{dd}$ is connected via the resistor 72, is left in the chip region 1 and cut off from $V_{ss}$, and the electric potential inputted into the detector 70 becomes $V_{dd}$. The detector 70 becomes valid by the control signal D and grasps a change in the electric potential of the monitoring wire 7 from $V_{ss}$ to $V_{dd}$ and outputs the detection signal A in a state in which the semiconductor device is cut out from the semiconductor wafer. A portion in which $V_{ss}$ is led out from the chip region 1 to the scribe region 2 exceeding the seal ring 3 and a portion in which $V_{ss}$ is led out from the resistor 72 to the scribe region 2 exceeding the seal ring 3 can be connected by a metallic wire of the monitoring wire 7 so that the portions can be separate from each other by a long distance. Accordingly, it becomes difficult for the thus cut wiring passage to be easily restored by means of FIB working.

[Application of Dicing Detector 71]

Figure 3:
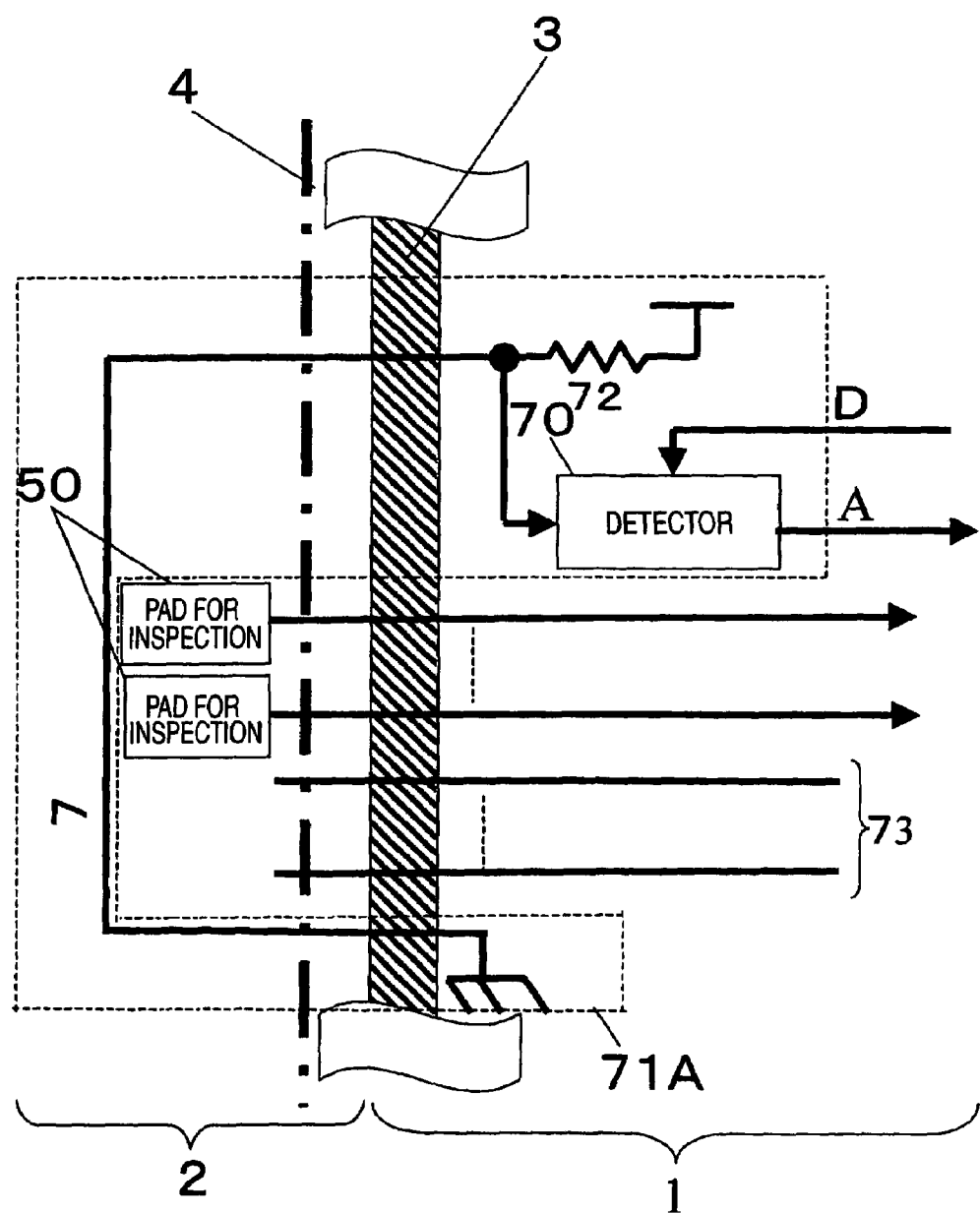
FIG. 3 is a schematic plan view showing a variation of the dicing detector shown in FIG. 2.

FIG. 3 is a view showing an application of the dicing detector 71. The dicing detector 71A is composed as follows. A portion in which $V_{ss}$ is led out from the chip region 1 to the scribe region 2 exceeding the seal ring 3 and a portion in which $V_{ss}$ is led out from the resistor 72 to the scribe region 2 exceeding the seal ring 3 are separate from each other by a long distance, and a plurality of pads 50 for inspection are arranged in the scribe region 2. A wire led from the scribe region 2 into the chip region exceeding the seal ring 3 and a dummy wire 73 connecting the scribe region 2 with the chip region 1 exceeding the seal ring 3 are inserted into the dicing detector 71A. According to the dicing detector 71A, it becomes more difficult for the passage to be specified. Therefore, the anti-tampering property against an illegitimate analysis can be enhanced. In the embodiments of the dicing detectors 71 and 71A, it is possible to adopt such a constitution that the control signal D is omitted and the detector 70 is made to be valid at all times.

[Second Embodiment of Dicing Detector]

Figure 4:
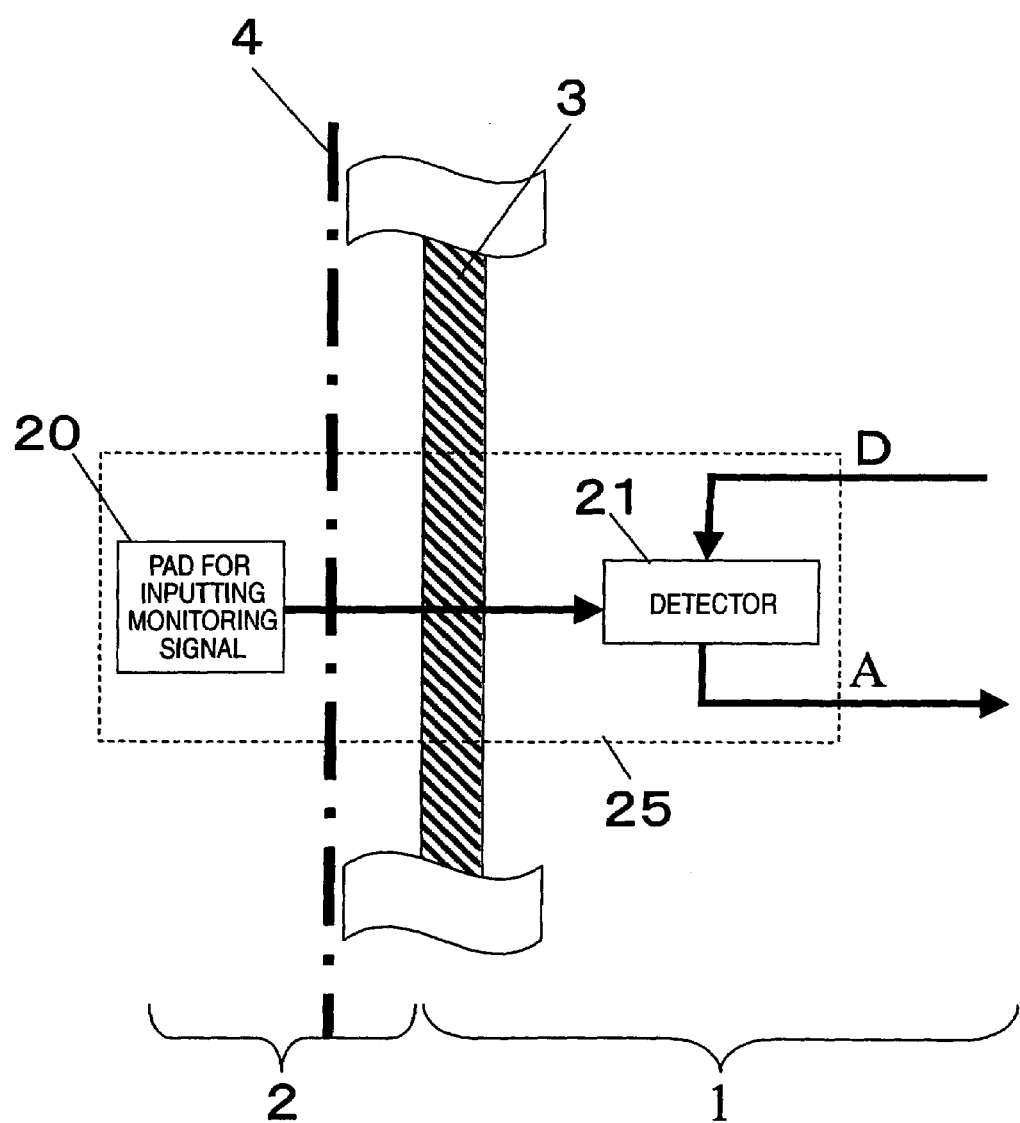
FIG. 4 is a schematic plan view showing another embodiment of the dicing detector shown in FIG. 1.

Referring to the arrangement view of FIG. 4, the dicing detector 25 of the second embodiment of the present invention will be explained below. The second dicing detector 25 includes: a pad 20 for inputting a monitor signal arranged in the scribe region 2; and a detector 21 arranged in the chip region into which a signal is inputted from the pad 20 for inputting the monitor signal.

Explanations will be made into the action of the dicing detector 25. Before the semiconductor device is cut off from the semiconductor wafer, a monitoring signal having an arbitrary electric characteristic is inputted from the pad 20 for inputting the monitor signal into the detector 21 at the time of inspecting the wafer. By the control signal D, the detection timing of the detector 21 is controlled. The electric characteristic of an arbitrary signal inputted from the pad 20 for inputting the monitor signal is monitored. When no problems are caused, the detection signal A in the state in which dicing is not conducted is outputted.

On the other hand, when the inspection of the wafer is completed and the scribe region 2 is cut off along the dicing line 4, the pad 20 for inputting the monitor signal is cut off together with the scribe region 2. Therefore, the monitoring signal input into the detector 21 is physically shut off. The detector 21 grasps a change in the electric characteristic of the signal monitored and outputs the detection signal A in the state in which the semiconductor device is cut out from the semiconductor wafer. As long as the same signal as the monitoring input signal is not given from the outside to the detector 21 by chance, it is impossible to nullify the protection effect. For the above reasons, when the monitor input signal is not made to be simple, that is, when the monitor input signal is not made to be a fixed potential but the monitor input signal is made to be a high voltage, a negative voltage or a signal having a pulse phase difference, the same electric characteristic can not be easily given from the outside even by chance. Due to the foregoing, the anti-tampering property can be enhanced.

[Application of Dicing Detector 25]

Figure 5:
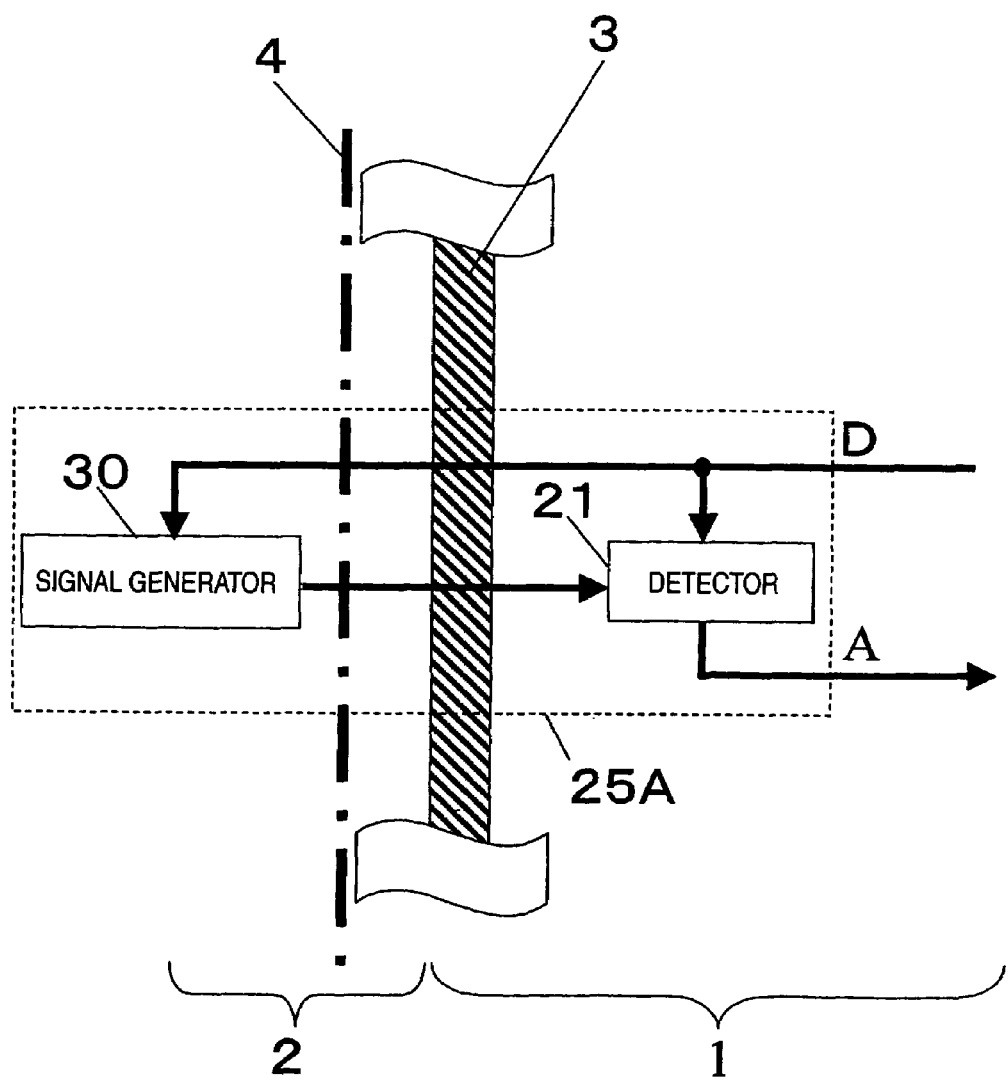
FIG. 5 is a schematic plan view showing a variation of the dicing detector shown in FIG. 4.

As an application of the dicing detector 25, as shown in FIG. 5, in the dicing detector 25A, the signal generator 30 is arranged instead of the input pad 20 for monitoring. By the control signal D, the signal generator 30 and the detector 21 are controlled. At the time of inspecting the wafer, the signal can be given from the signal generator 30 to the detector 21. Therefore, as compared with the dicing detector 25, the number of pads is decreased at the time of inspecting the wafer. Accordingly, the wafer inspection cost can be reduced.

[Third Embodiment of Dicing Detector]

Figure 6:
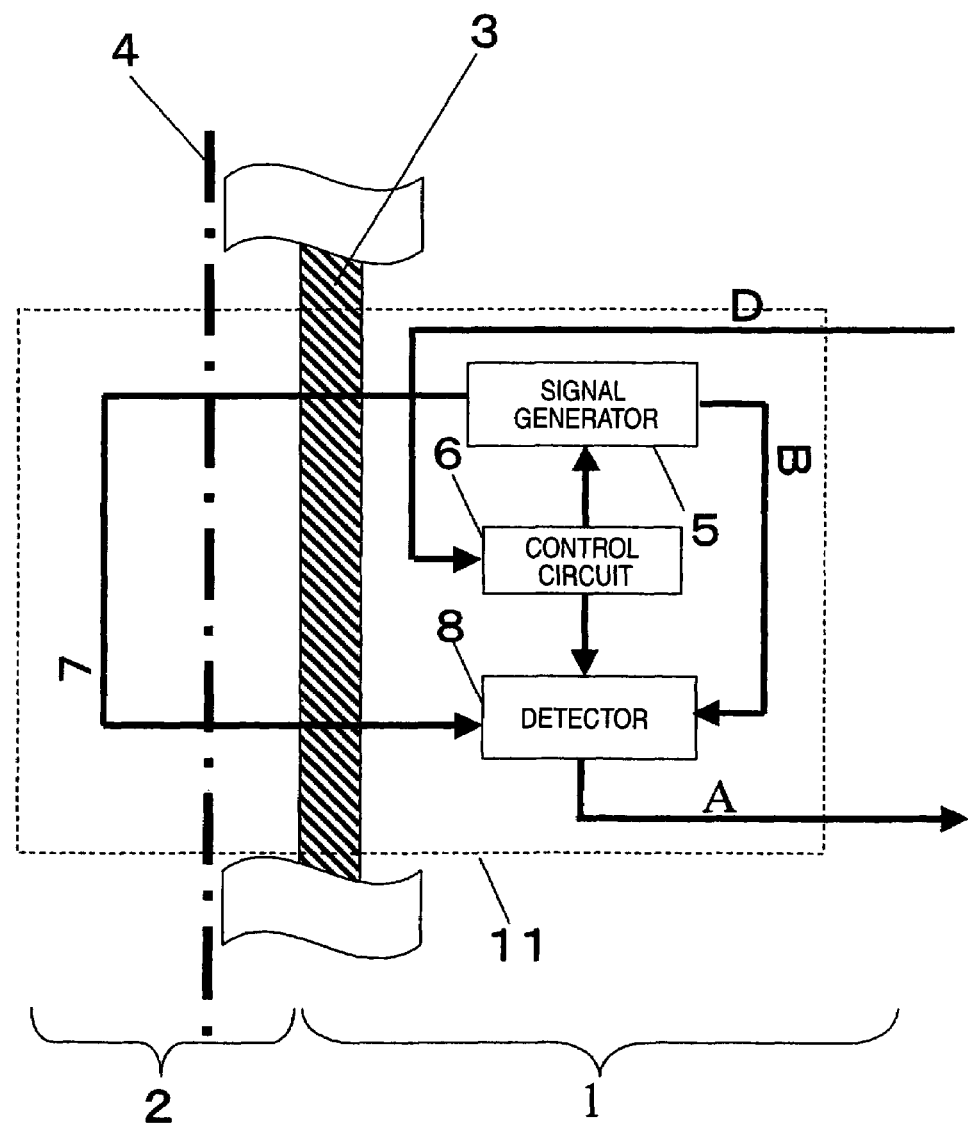
FIG. 6 is a schematic plan view showing another embodiment of the dicing detector shown in FIG. 1.

FIG. 6 is an arrangement view of the dicing detector 11 of the third embodiment of the present invention. The dicing detector 11 includes: a signal generator 5 arranged in the chip region 1; a monitoring wire 7 led into the scribe region 2 from the signal generator 5 exceeding the seal ring 3, the monitoring wire 7 passing in the scribe region 2 and exceeding the seal ring 3 again and laid in the chip region 1; a detector 8 for monitoring the electric characteristic of the monitoring wire 7; and a control circuit 6 for controlling the signal generator 5 and the detector 8.

Next, explanations will be made into the action of the timing detector 11. By the control signal D, the control circuit 6 is started. When a control signal is received from the control circuit 6, the signal generator 5 generates a signal of a predetermined electric characteristic at an arbitrary timing. This signal is transmitted to the detector 8 through the monitoring wire 7 and the reference signal wire B, and the electric characteristic of the monitoring wire 7 and that of the reference signal B are compared and collated with each other. In the case where it is judged that the electric characteristics are the same, the detection signal A in the state in which the semiconductor device is not cut out from the semiconductor wafer yet is outputted. In the case where it is judged that the electric characteristics are different from each other, the detection signal A in the state in which the semiconductor device is cut out from the semiconductor wafer is outputted. When the signal generated from the signal generator is devised, the anti-tampering property of the dicing detector 11 can be further enhanced. For example, a comparison of the signal pattern of the monitoring wire 7 with the signal pattern of the reference signal B, a comparison of the electric characteristics and a comparison of the wire physical characteristic of the monitoring wire 7 with the wire physical characteristic of the reference signal B are effective. When the judgment is made by the combination of them, an illegitimate analysis, which is conducted by utilizing the monitoring wire 7 left in the semiconductor device after the completion of dicing and by giving a signal from the outside, becomes more difficult. Therefore, the judgment made by the combination of them is effective.

[Application 1 of Dicing Detector 11]

Figure 7:
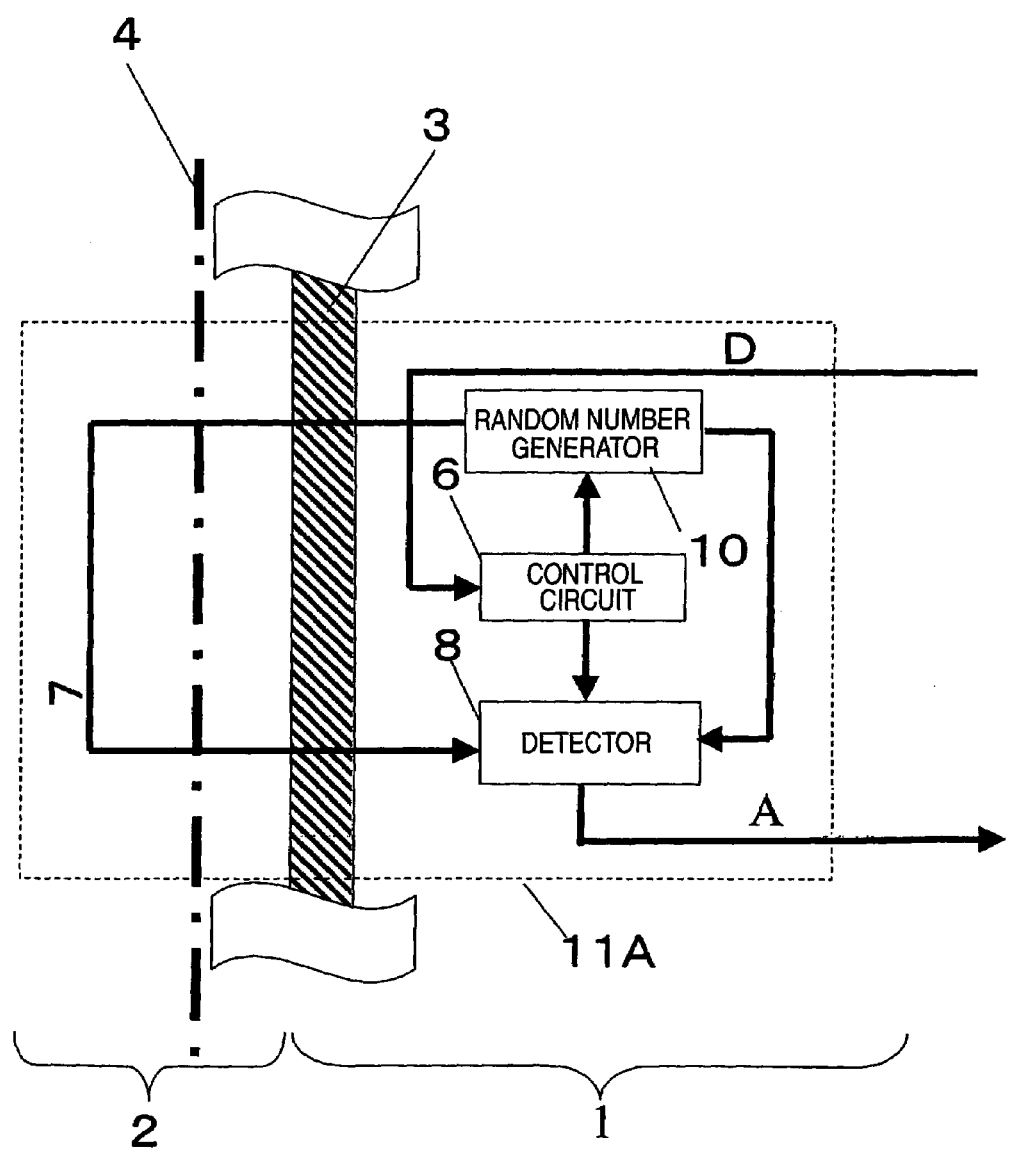
FIG. 7 is a schematic plan view showing a variation of the dicing detector shown in FIG. 6.

FIG. 7 is an arrangement view showing the dicing detector 11A which is the first application of the dicing detector 11. In the case of the dicing detector 11A, when the signal generator 5 is replaced with the random number generator 10, the anti-tampering property can be enhanced. Against an illegitimate attack in which the wire of the reference signal B is found by observation in the dicing detectors 11 and 11A and in which the reference signal B is observed by the probe established outside so as to trace the signal and in which after the wire of the reference signal B is diced, the monitoring wire 7 left in the semiconductor device is connected by a bypass line by means of FIB processing technique. In this case, it is effective to adopt a detection system in which the wire physical characteristic of the monitoring wire 7 and that of the reference signal B are monitored and compared with each other. However, in the other detection system, the wire of the reference signal B is arranged on the lower wiring layer, and a plurality of other wires are made to pass on the upper layer. An original signal is sent from the signal generator 5 to the monitoring wire 7. Concerning the reference signal B, the decoded signal is sent. After that, the reference signal B is encoded by the detector 8 and compared with the signal sent from the monitoring wire 7. Alternatively, the signal is ciphered by the signal generator 5 and then outputted as the reference signal B and then deciphered by the detector 8. Alternatively, the signal is sent to the monitoring wire 7 in parallel, and the reference signal B is sent in series. In this way, when the signal forms of the monitoring wire 7 and the reference signal B are changed and further the physical shape of the wire is changed, the anti-tampering property can be further enhanced.

[Application 2 of Dicing Detector 11]

Figure 8:
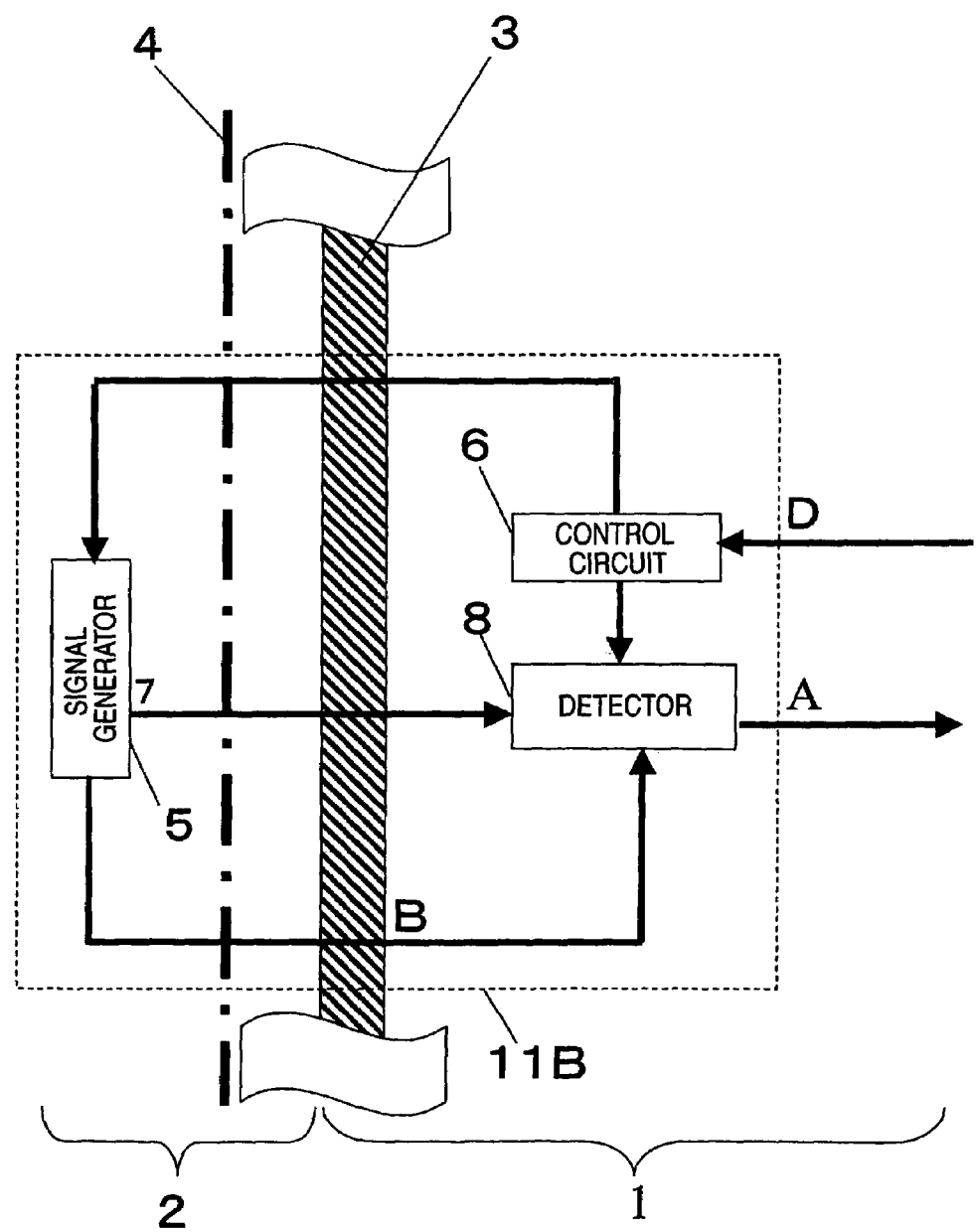
FIG. 8 is a schematic plan view showing another variation of the dicing detector shown in FIG. 6.

FIG. 8 is an arrangement view showing the dicing detector 11B of the second application form of the dicing detector 11. According to this constitution, the anti-tampering property can be more easily enhanced. In the dicing detector 11, the signal generator 5 is arranged in the scribe region 2. A control signal from the control circuit 6 to the signal generator 5 exceeds the seal ring 3 and is connected to the signal generator 5 in the scribe region 2. The reference signal B is led from a position, which is distant from the detector 8 in the scribe region 2, to the chip region 1 exceeding the seal ring 3 and connects with the detector 8. When the dicing is conducted along the dicing line 4, the wires of the signal generator 5 and the reference signal B are cut off. Therefore, it is impossible to observe the reference signal B. Further, an illegitimate analysis attack can be considered in which the monitoring wire 7 left in the semiconductor device and the wire of the reference signal B are short-circuited by means of FIB processing or the other conductive wire and the same signal is sent from the outside. However, when a distance between the position at which the monitoring wire 7 is led in the chip region 1 and the position at which the wire of the reference signal B is led in the chip region 1 is extended and when the signal forms of the monitoring wire 7 and the reference wire B are changed or when the physical shape of the wire is changed, the difficulty can be easily increased. Therefore, the anti-tampering property can be enhanced.

[Fourth Embodiment of Dicing Detector]

Figure 9:
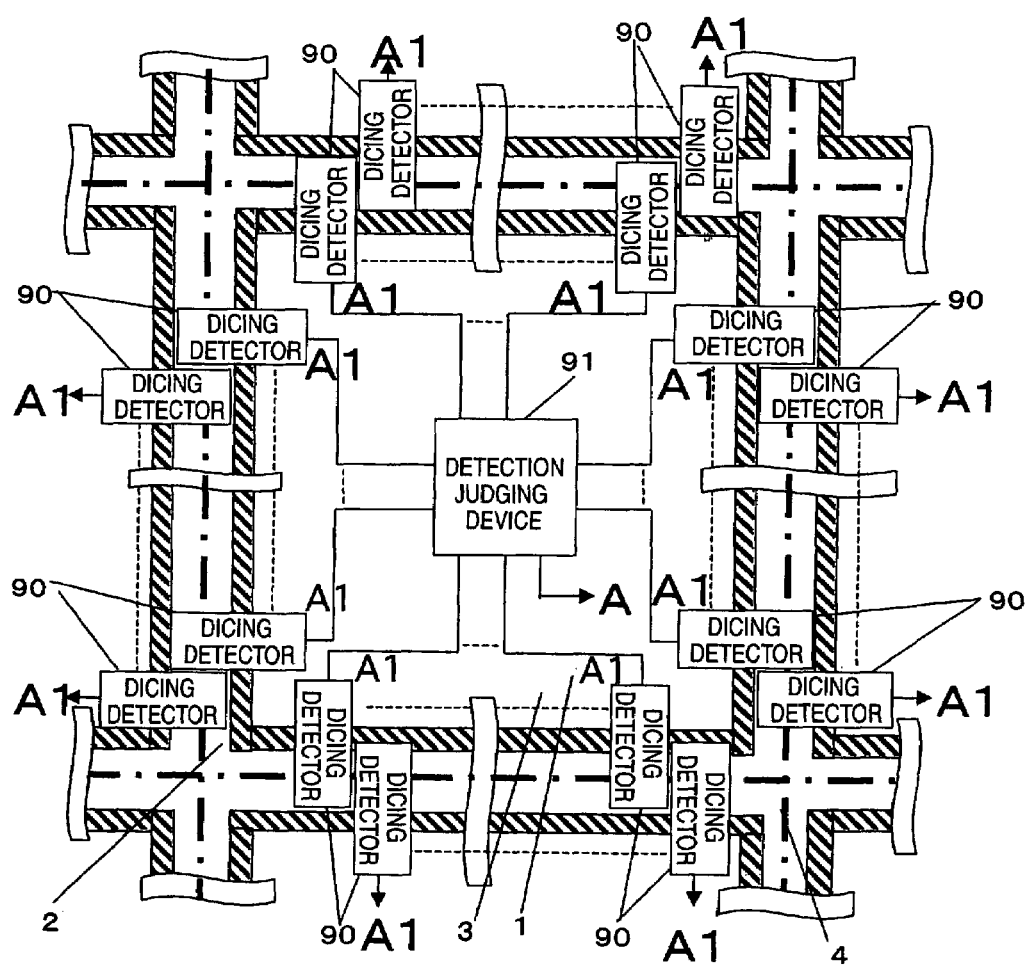
FIG. 9 is a partial plan view of the semiconductor wafer having the dicing detector shown in FIGS. 2 to 8.

Referring to the arrangement view of FIG. 9, a semiconductor device having the dicing detector of the fourth embodiment of the present invention will be explained below. This semiconductor device includes: one dicing detector 90 of the dicing detectors of the first to the third embodiment; and a detection judgment device 91 to judge the detection according to the content of the detection signal A1 sent from each dicing detector 90. The action of the semiconductor device having the fourth dicing detector 90 will be explained below.

Concerning the detection signals A1 outputted from a plurality of dicing detector 90, only when all detection signals A1 show a state in which the semiconductor device has not been cut out from the semiconductor wafer in the detection judgment device 91, the detection signal A is outputted as a signal showing a state in which the semiconductor device has not been cut out from the semiconductor wafer. Accordingly, when even one dicing detector 90 outputs the detection signal A1 showing a state in which the semiconductor device has been cut out from the semiconductor wafer, the detection signal A showing the state in which the semiconductor device has been cut out from the semiconductor wafer is outputted.

Therefore, unless a person who conducts an illegitimate act simultaneously attacks a plurality of dicing detector 90 by an illegitimate means and succeeds in conducting the illegitimate act, it is impossible for the person to nullify the protection effect, that is, the tampering becomes very difficult. Further, when the different types of the dicing detectors 90, which are used in the first to the third embodiment, are respectively employed for the plurality of dicing detectors 90, it becomes more difficult for the person to conduct an illegitimate act, and the anti-tampering property can be remarkably enhanced. Furthermore, from the viewpoint of the reliability of the dicing process, it is sufficient that either of the plurality of the dicing detectors 90 detects a state in which the semiconductor device has been cut out from the semiconductor wafer. Therefore, it is possible to provide a very high yield of the working reliability.

Second Embodiment

Figure 10:
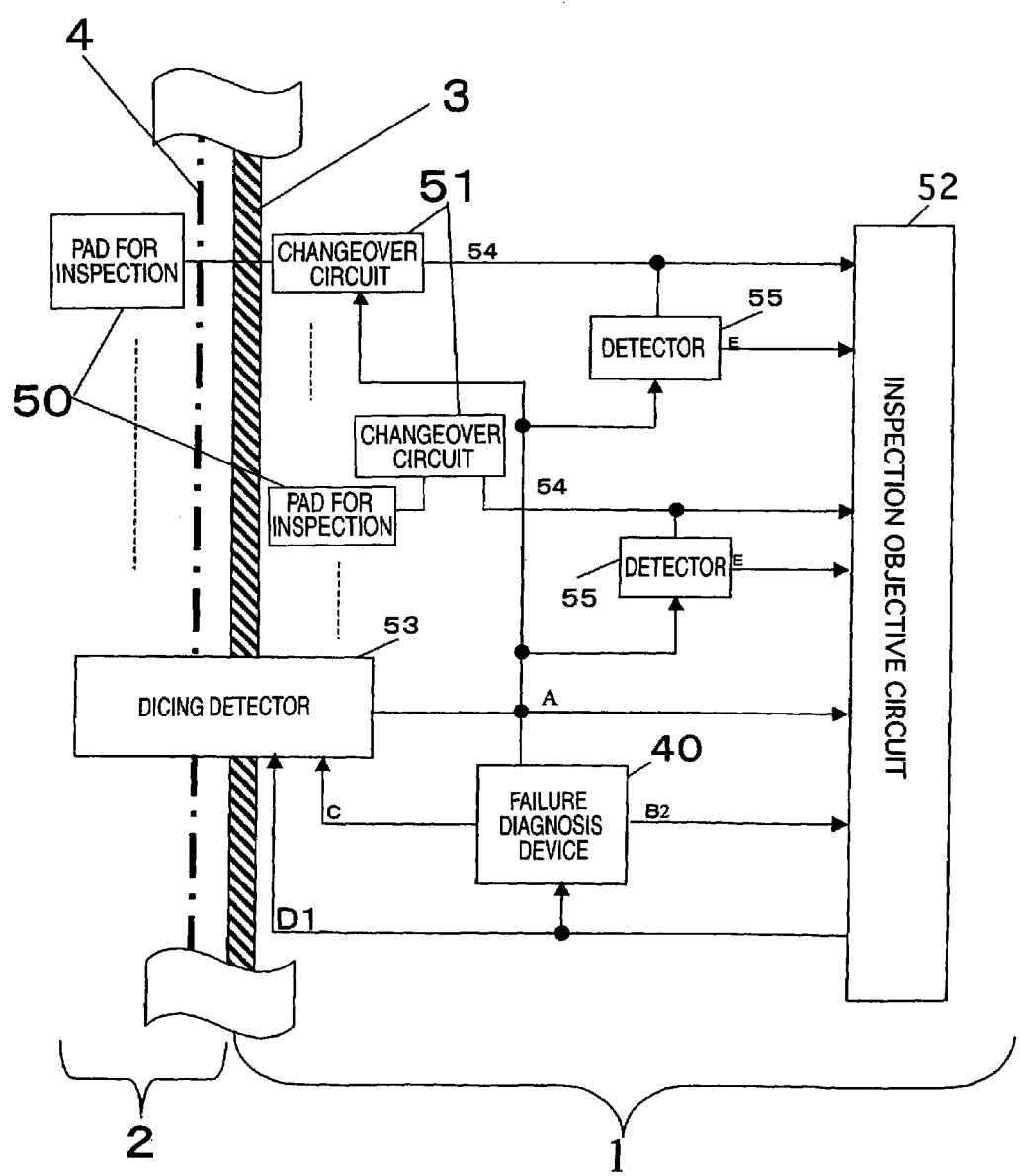
FIG. 10 is an enlarged schematic plan view showing a portion of the semiconductor wafer of the second embodiment.

Next, referring to FIG. 10, the second embodiment of the present invention will be explained below. As shown in FIG. 10, in addition to the first embodiment, the semiconductor wafer further includes a failure diagnosis device 40 for judging whether or not the dicing detector 53 functions properly, and the control signal D1 to control the dicing detector 53 and to control the failure diagnosis device 40 is inputted from the inspection objective circuit 52, and the detection signal A of the dicing detector 53 is connected to the failure diagnosis device 40 and further the failure detection signal B2 is inputted from the failure diagnosis device 40 into the inspection objective circuit 52.

The action of the protection circuit composed as described above will be explained below. At the time of starting the electric power source of the semiconductor device, in order to inspect the detecting function, information about the states before dicing and after dicing is sent several times as an inspection pattern (test signal) by the control signal D1 from the failure diagnosis device 40 to the dicing detector 53 so as to activate the dicing detector 53 and generate the detection signal A. The thus generated detection signal A is compared with the expected value by the failure diagnosis device 40. According to the result of the comparison, the failure detection signal B2 is outputted. In the case where the detection signal A and the expected value coincide with each other, the failure detection signal B2 notifies the inspection objective circuit 52 of the fact that the dicing detector 53 is in a normal state, and the action is conducted in the same manner as that of the first embodiment.

On the other hand, in the case where the detection signal A and the expected value do not coincide with each other, the failure detection signal B2 becomes a signal showing a state in which the timing detector 53 is in trouble. Irrespective of the state of the detection signal A, the semiconductor device is changed to the safety mode by the failure detection signal B2 which has been transmitted to the inspection objective circuit 52. According to the above embodiment, even when a person who conducts an illegitimate act finds the wire of the detection signal A and attacks in such a manner that a signal showing the state in which the semiconductor device is not cut out from the semiconductor wafer is given from the outside by an appropriate illegitimate means, the protection effect can be exhibited. Therefore, it is possible to provide a semiconductor device and semiconductor wafer, the anti-tampering property of which is remarkably enhanced.

Third Embodiment

Figure 11:
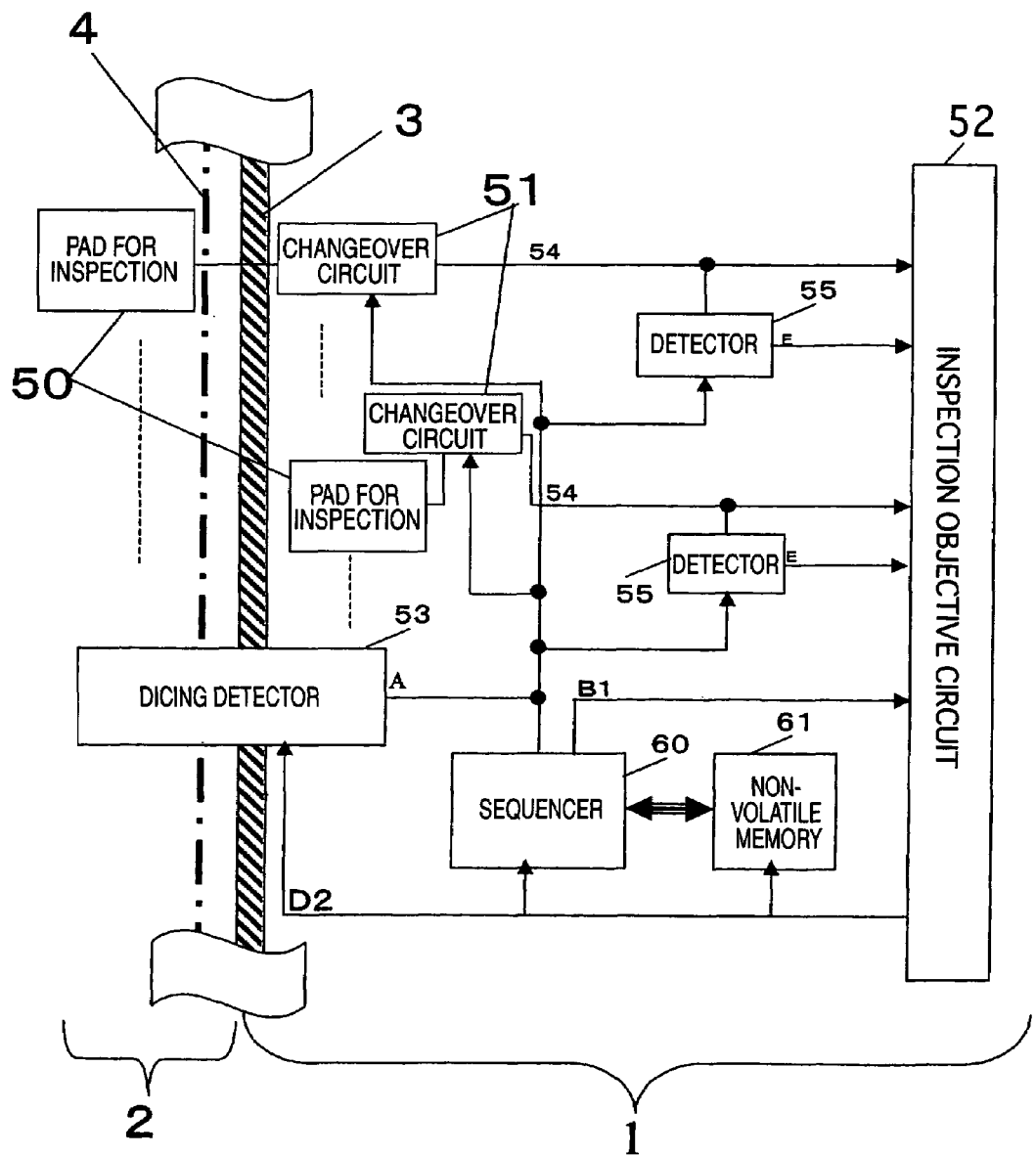
FIG. 11 is an enlarged schematic plan view showing a portion of the semiconductor wafer of the third embodiment.
Figure 12:
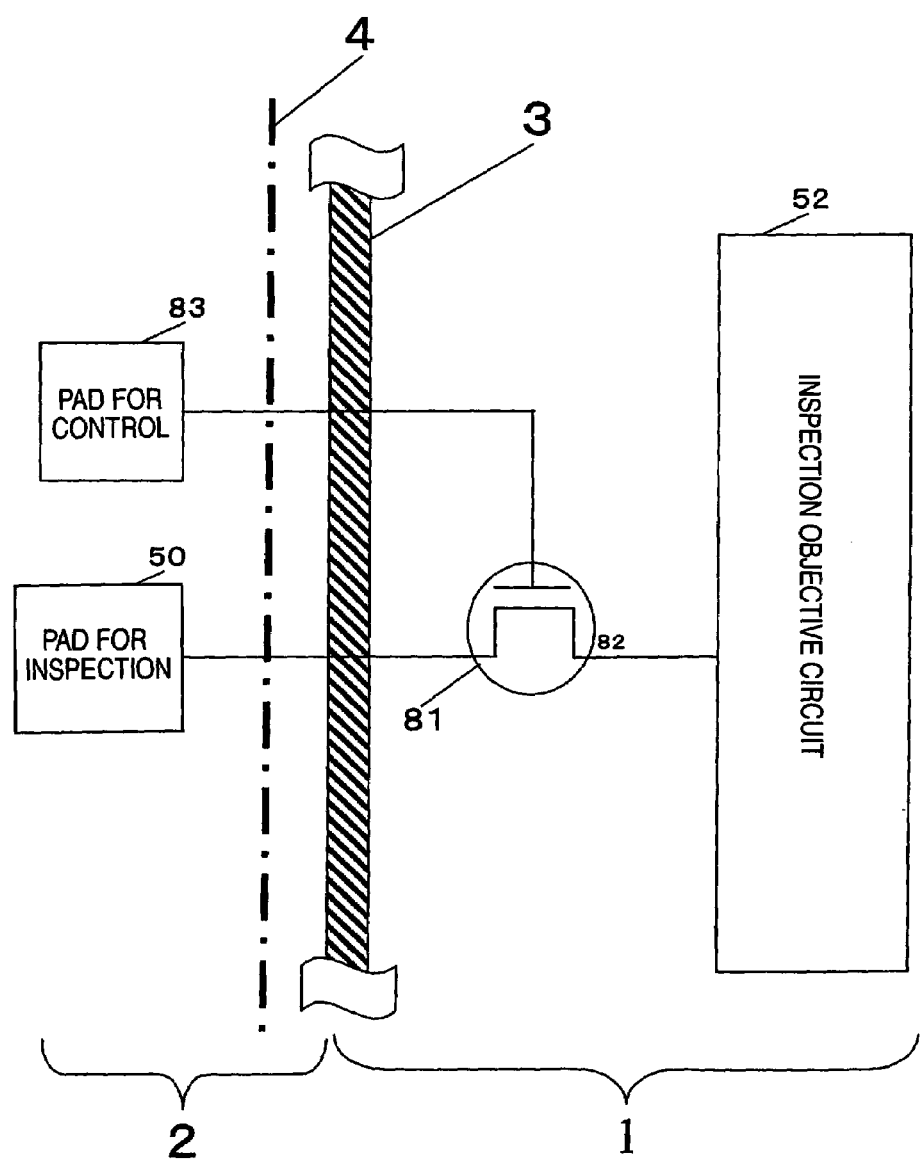
FIG. 12 is an enlarged schematic plan view showing a portion of the conventional semiconductor wafer.

Finally, the third embodiment of the present invention will be explained, referring to FIG. 11. As shown in FIG. 11, in addition to the first embodiment, the semiconductor wafer includes a sequencer 60 which conducts reading/writing of the information of the non-volatile memory 61 according to the information of the non-volatile memory 61 and the state of the detection signal A sent from the dicing detector 53 and outputs the illegitimate detection signal B1, and the control signal D2, which respectively controls the dicing detector 53, the sequencer 60 and the non-volatile memory 61, is inputted from the inspection objective circuit 52. Further, the illegitimacy detection signal B1 of the sequencer 60 is inputted into the inspection objective circuit 52.

The action of the protection circuit composed as described above will be explained below. The dicing detector 53 is operated by the control signal D2, and the detection signal A is sent to the sequencer 60. In the same manner, the sequencer 60 and the non-volatile memory 61 are started by the control signal D2, and information is read out from the non-volatile memory 61 to the sequencer 60. When the information read our from the non-volatile memory 61 is in a state in which the wafer is inspected (For example, all are zero.) and the state of the detection signal A sent from the dicing detector 53 is a state in which the semiconductor device is not cut out from the semiconductor wafer, the sequencer 60 acts in the same manner as that of the state in which the semiconductor device is not cut out from the semiconductor wafer in the first embodiment.

On the other hand, in the case where the state of the detection signal A sent from the dicing detector 53 is a state in which the semiconductor device is cut out from the semiconductor wafer, irrespective of the information read out from the non-volatile memory 61, the information that the semiconductor device has been cut out from the semiconductor wafer is written in the non-volatile memory 61. After that, the same action as that of the state, in which the semiconductor device has been cut out from the wafer in the first embodiment of the present invention, is conducted.

Next, in the case where the information read out from the non-volatile memory 61 is information that the semiconductor device has been cut out from the semiconductor wafer, irrespective of the state of the detection signal A sent from the dicing detector 53, the information is not written in the non-volatile memory 61. At this time, when the state of the detection signal A sent from the dicing detector 53 is a state in which the semiconductor device has been cut out from the semiconductor wafer, the same action as that of the state in which the semiconductor device has been cut out from the semiconductor wafer in the first embodiment is conducted. However, when the state of the detection signal A sent from the dicing detector 53 is not a state in which the semiconductor device has been cut out from the semiconductor wafer, the illegitimate detection signal B1 is outputted from the sequencer 60, and the semiconductor device is changed into the safety mode.

Due to the foregoing, the following can be concluded. At the time of inspecting the wafer, protection is conducted according to the dicing detector. However, when the semiconductor device is cut out from the semiconductor wafer after the wafer inspection has been completed and when the semiconductor device is activated once before it is shipped under the condition that information in the shipping state is written in the non-volatile memory, as long as the information in the non-volatile memory is not rewritten, the anti-tampering property can be perfectly protected even when the dicing detector is nullified by any illegitimate means, that is, the anti-tampering property can be remarkably enhanced.

As described above, according to the semiconductor wafer of the present invention, even when any illegitimate analysis means, in which the leading wire from the pad is utilized, is used, the protection effect can be exhibited, and the semiconductor wafer of the present invention can be easily provided without adding a specific manufacturing process to before and after the dicing process.

The semiconductor wafer of the present invention includes: a detection means for detecting the cutting after the scribe region has been cut; and a changeover means for changing over the electric potential of the lead-in line which is led from the inspection pad, and an abnormal electric potential between the changeover means and the inspection objective circuit is detected and the inspection objective circuit is changed to the safety mode. Due to the above constitution, it is possible to prevent a person from conducting an illegitimate analysis in which the lead-in wire from the pad after the cutting of the scribe region is utilized. Therefore, the present invention is effectively applied to a semiconductor wafer having a protecting function of protecting the secret information, which is stored in the semiconductor device, from being analyzed and tampered.

What is claimed is:

1. A semiconductor wafer on which a plurality of semiconductor devices including an inspection objective circuit are arranged via a scribe region, comprising:
   a detection means, detecting that the scribe region has been cut off;
   a changeover means, after detection that the scribe region has been cut off, changing over to a safety mode refusing an inspection mode command inputted to the inspection objective circuit, by changing over an electric potential of an inspection mode input terminal into a fixed electric potential, the inspection mode input terminal being a terminal in which an inspection mode command is input, among terminals of the inspection objective circuit; and
   a protection means, making the semiconductor devices fixed to a reset state if the defect is detected while monitoring the fixed electric potential applied to the inspection mode input terminal.

2. The semiconductor wafer according to claim 1, wherein at least one pad for inspection which is corresponding to the inspection objective circuit and at least one dummy wiring path disguised as a wiring path from the pad for inspection to the inspection objective circuit are provided in the semiconductor devices.

3. The semiconductor wafer according to claim 1, the detection means including:
   a resistor, connected to an electric potential of the electric power source provided in the semiconductor device;

a monitoring wire, connected to the resistor and also connected to an electric potential of the ground in the semiconductor device while crossing a dicing line in the scribe region; and a detection means, detecting a change in the electric potential of the monitoring wire.

4. The semiconductor wafer according to claim 3, wherein the monitoring wire is arranged surrounding a pad for inspection arranged in the scribe region or surrounding a dummy wire laid in the scribe region from the semiconductor device.

5. The semiconductor wafer according to claim 1, wherein the detection means includes:

a pad, inputting a monitor signal arranged in the scribe region, giving a signal of an arbitrary characteristic to the monitoring wire; and a characteristic change detection means, detecting a change in the characteristic of the monitoring wire.

6. The semiconductor wafer according to claim 1, wherein the detection means includes:

a signal generating means, arranged in the scribe region, for giving a signal of an arbitrary characteristic to the monitoring wire; and a characteristic change detection means, detecting a change in the characteristic of the monitoring wire.

7. The semiconductor wafer according to claim 1, wherein the detection means includes:

a signal generating means, arranged in the semiconductor device, giving a signal of an arbitrary characteristic to the monitoring wire; and a characteristic abnormality detection means, detecting a characteristic abnormality of the monitoring wire with respect to a reference signal to detect the cutting of the scribe region.

8. The semiconductor wafer according to claim 1, wherein the detection means includes:

a signal generating means, arranged in the scribe region, giving a signal of an arbitrary characteristic to the monitoring wire; and a characteristic abnormality detection means, detecting a characteristic abnormality of the monitoring wire with respect to a reference signal to detect the cutting of the scribe region.

9. The semiconductor wafer according to claim 7 or 8, wherein the signal generation means generates random numbers.

10. The semiconductor wafer according to claim 1, further comprising:

a judgment means, judging the cut of the scribe region according to the detection signals sent from a plurality of detection means.

11. The semiconductor wafer according to claim 1, further comprising:

a failure diagnosis means, diagnosing a failure of the detection means according to the result of comparison between the detection output of the detection means with respect to a test signal given to the detection means and the expected value.

12. The semiconductor wafer according to claim 1, further comprising: a memory, accommodating information showing whether or not the scribe region has been cut; and a judgment means for judging the cut of the scribe region by comparing the output of the detection means with the information stored in the memory.

* * * * *